US010644680B1

(12) United States Patent
Paraschou et al.

(10) Patent No.: US 10,644,680 B1
(45) Date of Patent: May 5, 2020

(54) APPLICATION OF DUTY CYCLE CORRECTION TO A LEVEL SHIFTER VIA A FEEDBACK COMMON MODE RESISTOR

(71) Applicant: Advanced Micro Devices, Inc., Santa Clara, CA (US)

(72) Inventors: Milam Paraschou, Dellwood, MN (US); Tracy J. Feist, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/369,610

(22) Filed: Mar. 29, 2019

(51) Int. Cl.
*H03K 3/017* (2006.01)
*H03K 7/08* (2006.01)
*H03K 19/0175* (2006.01)

(52) U.S. Cl.
CPC .............. *H03K 3/017* (2013.01); *H03K 7/08* (2013.01); *H03K 19/017509* (2013.01)

(58) Field of Classification Search
CPC ... H03K 3/017; H03K 7/08; H03K 19/017509
USPC ........................................................ 327/175
See application file for complete search history.

(56) References Cited

U.S. PATENT DOCUMENTS

| | | | |
|---|---|---|---|
| 9,583,162 B1 | 2/2017 | Choi | |
| 9,979,382 B1* | 5/2018 | Chao | H03K 5/1565 |
| 10,205,445 B1* | 2/2019 | Kansal | H03F 3/45179 |
| 10,333,527 B2 | 6/2019 | Forey et al. | |
| 10,547,297 B2 | 1/2020 | Elbadry et al. | |
| 2007/0132494 A1* | 6/2007 | Kim | H03K 5/023 327/175 |
| 2008/0157841 A1* | 7/2008 | Johnson | H03K 5/003 327/175 |
| 2012/0081163 A1* | 4/2012 | Hesen | H03K 5/1565 327/175 |
| 2012/0280732 A1* | 11/2012 | Roytman | H03K 5/086 327/175 |
| 2015/0244321 A1* | 8/2015 | Suda | H03K 3/017 327/175 |

* cited by examiner

*Primary Examiner* — William Hernandez
(74) *Attorney, Agent, or Firm* — Kowert Hood Munyon Rankin and Goetzel PC; Rory D. Rankin (57) ABSTRACT

Systems, apparatuses, and methods for applying duty cycle correction to a level shifter via a feedback common mode resistor are disclosed. A circuit includes a capacitor, an inverter, and at least one feedback resistor. An input signal is received and coupled through the capacitor to the inverter. To correct for duty cycle distortion on the input signal, a duty cycle correction signal is applied to the at least one feedback resistor in the feedback path. The duty cycle correction signal can be applied as a voltage or as a current. In one implementation, the location of the injection point for applying the duty cycle correction signal within the at least one feedback resistor is programmable.

20 Claims, 6 Drawing Sheets

APPLICATION OF DUTY CYCLE CORRECTION TO A LEVEL SHIFTER VIA A FEEDBACK COMMON MODE RESISTOR

BACKGROUND

Description of the Related Art

Modern semiconductor chips include a variety of circuits and components to facilitate fast and efficient computation. When transferring information between functional blocks in a semiconductor chip, electrical signals are typically sent on metal traces. Transmitters in a first functional block send the electrical signals across the metal traces. Receivers in a second functional block receive the electrical signals. In some cases, the two functional blocks are within a same die. In other cases, the two functional blocks are on separate dies.

The processing speed of information processing systems and devices continues to increase as new systems and devices are developed. Additionally, for high-speed signal transmission, signals are often transmitted at low amplitude levels. Circuits for transmitting high-speed signals can exhibit variations in duty cycle caused by variations in manufacturing process, operating voltage, temperature, or other facts. In some cases, it is important to accurately control a duty cycle of a clock used to transfer data between components. For example, data can be transferred to and from a high-speed memory on the rising and/or falling edges of a clock signal. If the clock duty cycle is not 50% or within some margin of 50%, the timing between the rising and falling edges can be distorted, causing data to be clocked in or out of the memory at incorrect times. For high-speed, low-amplitude signals, correcting for duty cycle distortion can be challenging.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, and methods for applying duty cycle correction to a level shifter via a feedback common mode resistor are disclosed. In one implementation, a circuit includes an inverter and at least one feedback resistor. An input is coupled through a capacitor to the inverter. To correct for duty cycle distortion, a duty cycle correction signal is applied to the at least one feedback resistor in the feedback path from the output of the inverter back to the input of the inverter. The duty cycle correction signal can be applied as a voltage or as a current. In one implementation, the injection point where the duty cycle correction signal is inserted into the feedback path is programmable.

Figure 1:
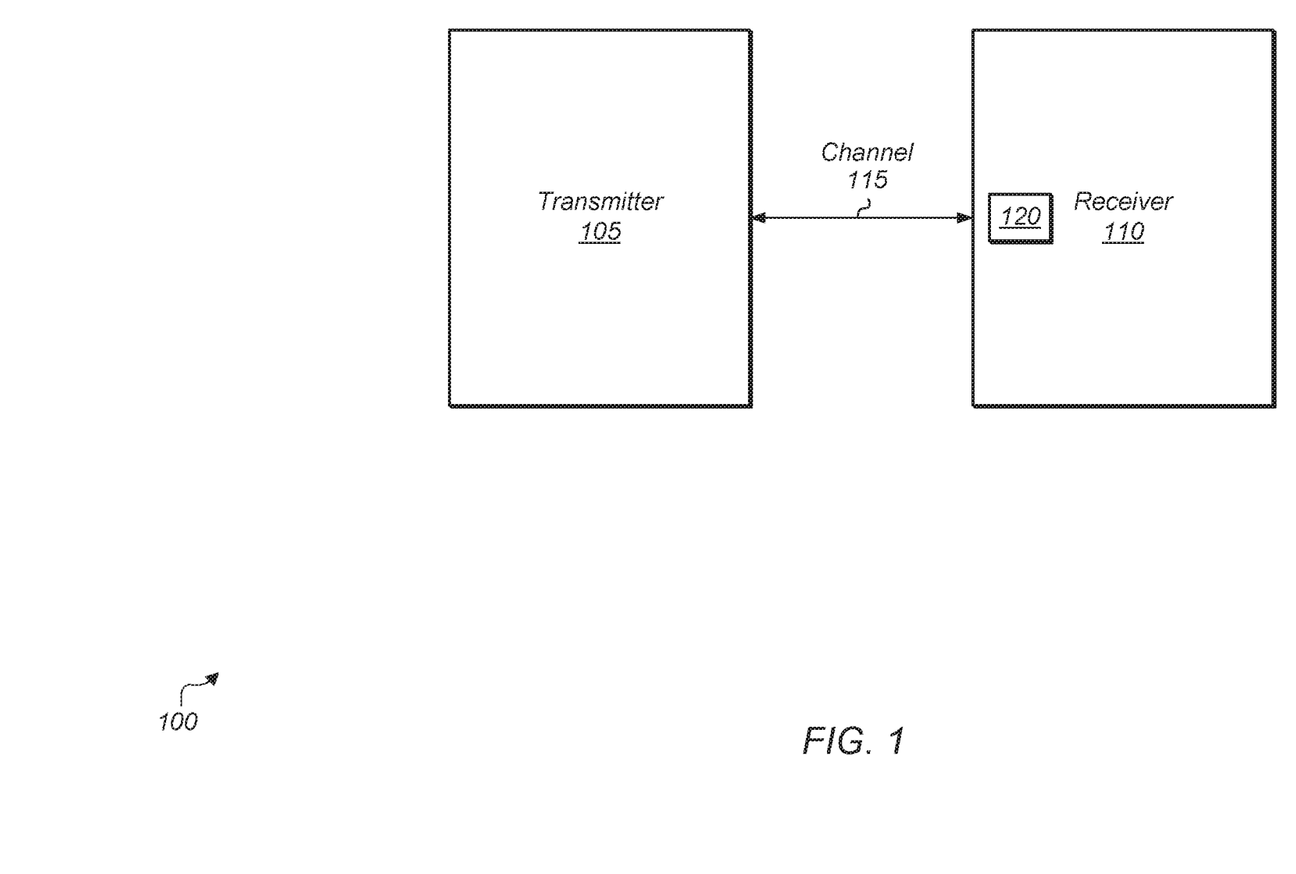
FIG. 1 is a block diagram of one implementation of generic computer or communication system including a transmitter and a receiver.

Referring now to FIG. 1, a block diagram of one implementation of a generic computer or communication system 100 including a transmitter 105 and a receiver 110 is shown. In one implementation, transmitter 105 transmits data to receiver 110 over communication channel 115. Depending on the implementation, communication channel 115 is a cable, backplane, one or more metal traces, or other type of communication channel. For example, in one implementation, channel 115 is one or more metal traces between two integrated circuits (i.e., chips) of a multi-chip module. At the physical layer, the communication between the transmitter 105 and the receiver 110 can be unidirectional or bidirectional according to a given transmission protocol. It is noted that system 100 can include any number and type of other devices. Additionally, system 100 can include any number of transmitter-receiver pairs dispersed throughout the system. Receiver 110 includes at least one duty cycle correction level shifter 120. In one implementation, duty cycle correction level shifter 120 applies a duty cycle correction signal within a feedback common mode resistor to correct for duty cycle distortion on an input signal.

Transmitter 105 and receiver 110 can be any type of devices depending on the implementation. In various implementations, transmitter 105 is a processing unit (e.g., central processing unit (CPU), graphics processing unit (GPU)) and receiver 110 is an input/output (I/O) device or a memory device. The memory device can be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices can be coupled onto a circuit board to form memory modules such as single inline memory modules (SIMMs), dual inline memory modules (DIMMs), etc. Alternatively, the memory devices can be mounted within a system on chip (SoC) or integrated circuit (IC) in a chip-on-chip configuration, a package-on-package configuration, or a multi-chip module (MCM) configuration.

In another implementation, transmitter 105 is an input/output (I/O) fabric and receiver 110 is a peripheral device. Examples of peripheral devices include network devices or devices for communicating wirelessly, such as wifi, Bluetooth, cellular, global positioning system, etc. The peripheral devices can also include storage devices, including RAM storage, solid state storage, or disk storage. The peripheral devices can also include user interface devices such as a display screen, including touch display screens or multitouch display screens, keyboard or other input devices, microphones, speakers, etc. In other implementations, transmitter 105 and receiver 110 are other types of devices. It is noted that system 100 can be any type of system, such as an IC, SoC, MCM, and so on.

Figure 2:
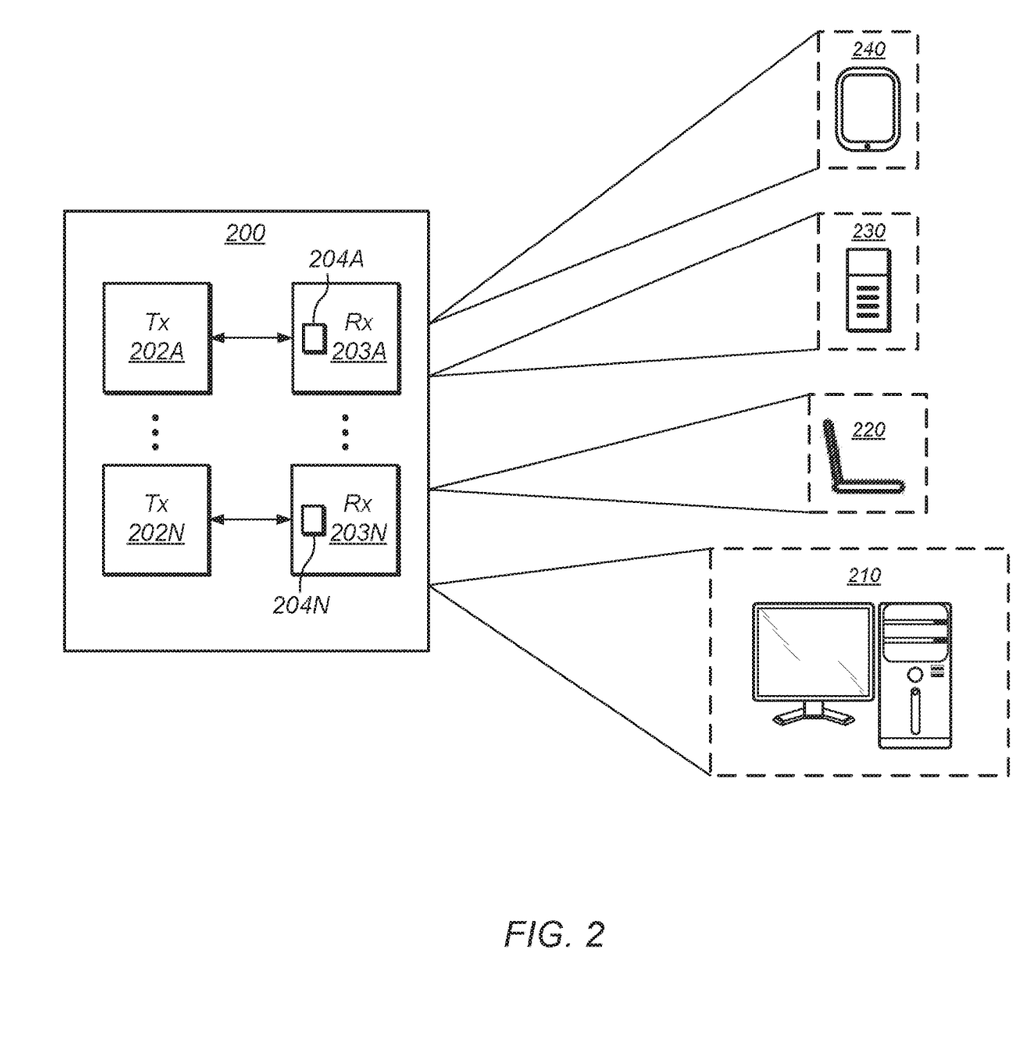
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other devices are possible and are contemplated. In the illustrated implementation, the system 200 includes any number of pairs of transmitters 202A-N and receivers 203A-N. Each receiver 203A-N includes at least one corresponding duty cycle correction level shifter 204A-N. More details regarding the structure and operation of duty cycle correction level shifters will be provided throughout the remainder of this disclosure.

Figure 3:
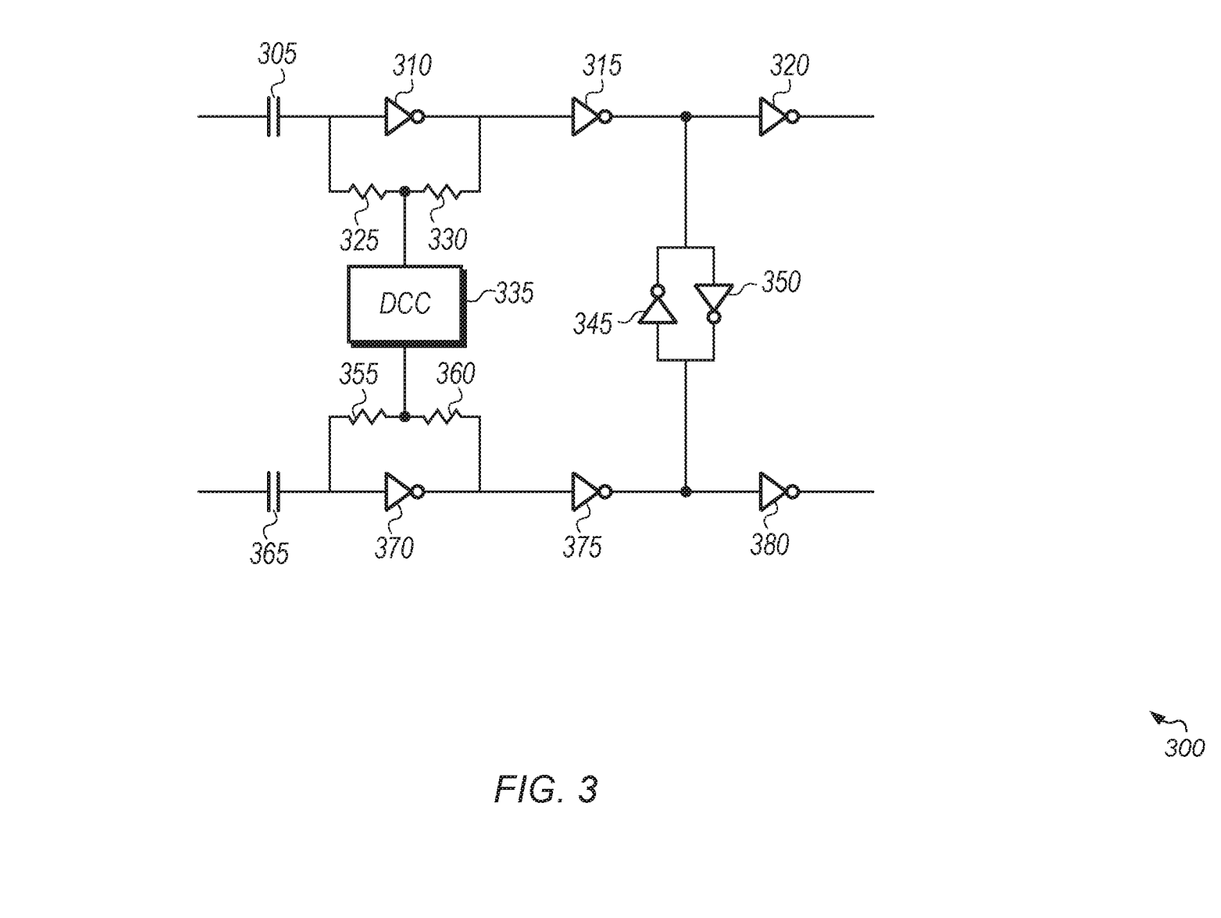
FIG. 3 is a diagram of one implementation of a duty cycle correction level shifter circuit.

Referring now to FIG. 3, a diagram of one implementation of a duty cycle correction level shifter circuit 300 is shown. In various implementations, the components of duty cycle correction level shifter circuit 300 are included in duty cycle correction level shifter 120 (of FIG. 1) and duty cycle correction level shifters 204A-N (of FIG. 2). In one implementation, the input signal received by circuit 300 is a differential signal. One component of the differential signal is coupled to one side of capacitor 305, while the other component of the differential clock signal is coupled to one side of capacitor 365. In another implementation, the input signal received by circuit 300 is a single-ended signal. The input signal can be a data signal or a clock signal, depending on the implementation.

The input differential signal components are fed to inverters 310 and 370 after passing through capacitors 305 and 365, respectively. Common mode feedback resistors 330 and 325 are coupled from the output of inverter 310 back to the input of inverter 310. While resistors 325 and 330 are shown as two separate resistors, it should be understood that resistors 325 and 330 represent any number of resistors that are connected in series in between the output and input of inverter 310. For example, in another implementation, a single feedback resistor is connected in between the output and input of inverter 310, with this single resistor having multiple tapping points. The tapping point for applying the value generated by duty cycle correction (DCC) unit 335 is programmable in this implementation. In other implementations, two or more resistors are coupled in between the output and input of inverter 310. Similarly, the resistors 355 and 360 in between the output and input of inverter 370 are representative of any number of resistors.

In one implementation, DCC unit 335 applies a signal with a first amplitude in between resistors 325 and 330 and DCC unit 335 applies a signal with a second amplitude in between resistors 355 and 360. In this implementation, the second amplitude is a reciprocal of the first amplitude. For example, in one implementation, a positive voltage offset is applied in between resistors 325 and 330 while a negative voltage offset is applied in between resistors 355 and 360, with the amplitude of the positive voltage offset equal to the amplitude of the negative voltage offset. In one implementation, the DCC unit 335 is a resistor ladder. In this implementation, a voltage is injected in between resistors 325 and 330. In another implementation, the DCC unit 335 is a current digital to analog converter (DAC). In this implementation, a current is injected in between resistors 355 and 360.

In one implementation, the output of inverter 310 is coupled to inverter 315 and then inverter 320. Similarly, in one implementation, the output of inverter 370 is coupled to inverter 375 and then inverter 380. In other implementations, the outputs of inverters 310 and 370 can be coupled to other components. In one implementation, inverters 345 and 350 are coupled in between the output of inverter 315 and the output of inverter 375. It should be understood that circuit 300 is merely one example of a circuit for injecting a DCC signal into the feedback resistor path of a level shifter. In other implementations, other circuits can be implemented with a different arrangement of components than is shown in FIG. 3.

Figure 4:
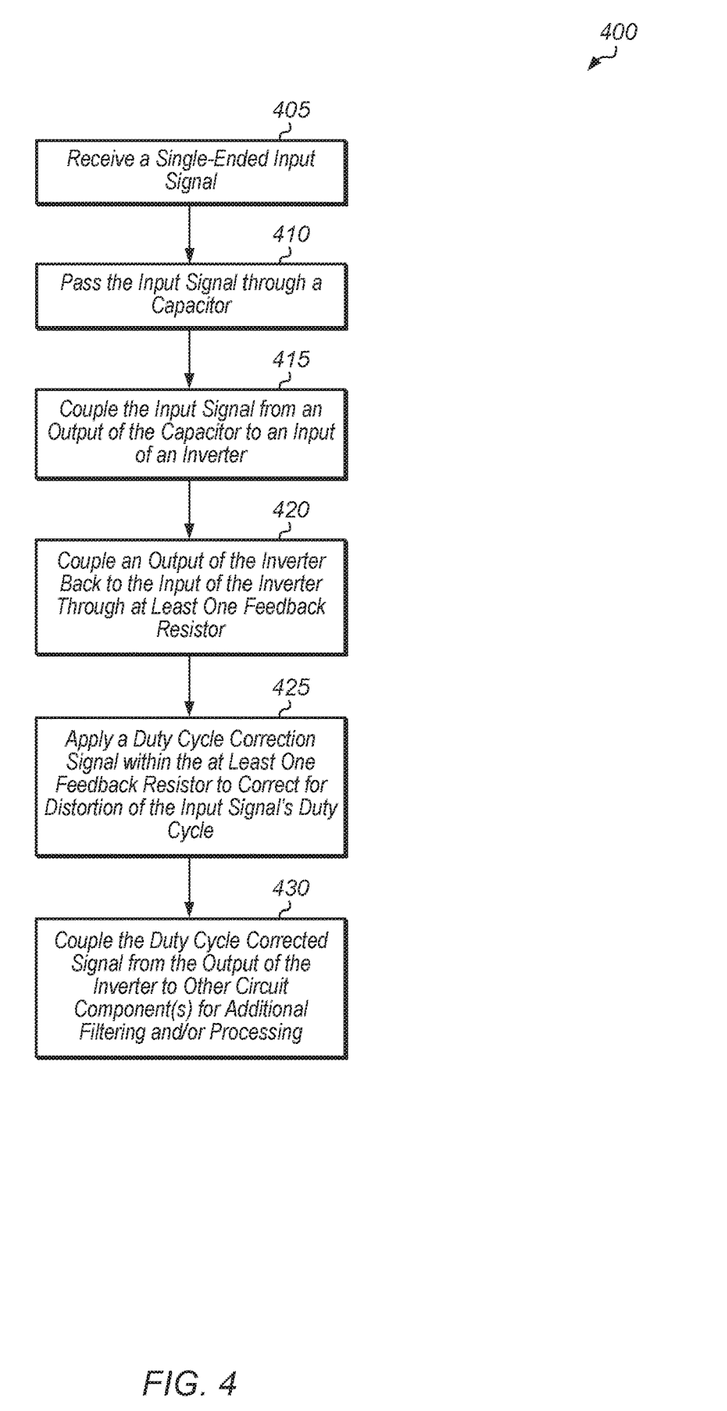
FIG. 4 is a generalized flow diagram illustrating one implementation of a method for applying a duty cycle correction value to a level shifter via a common mode resistor.
Figure 5:
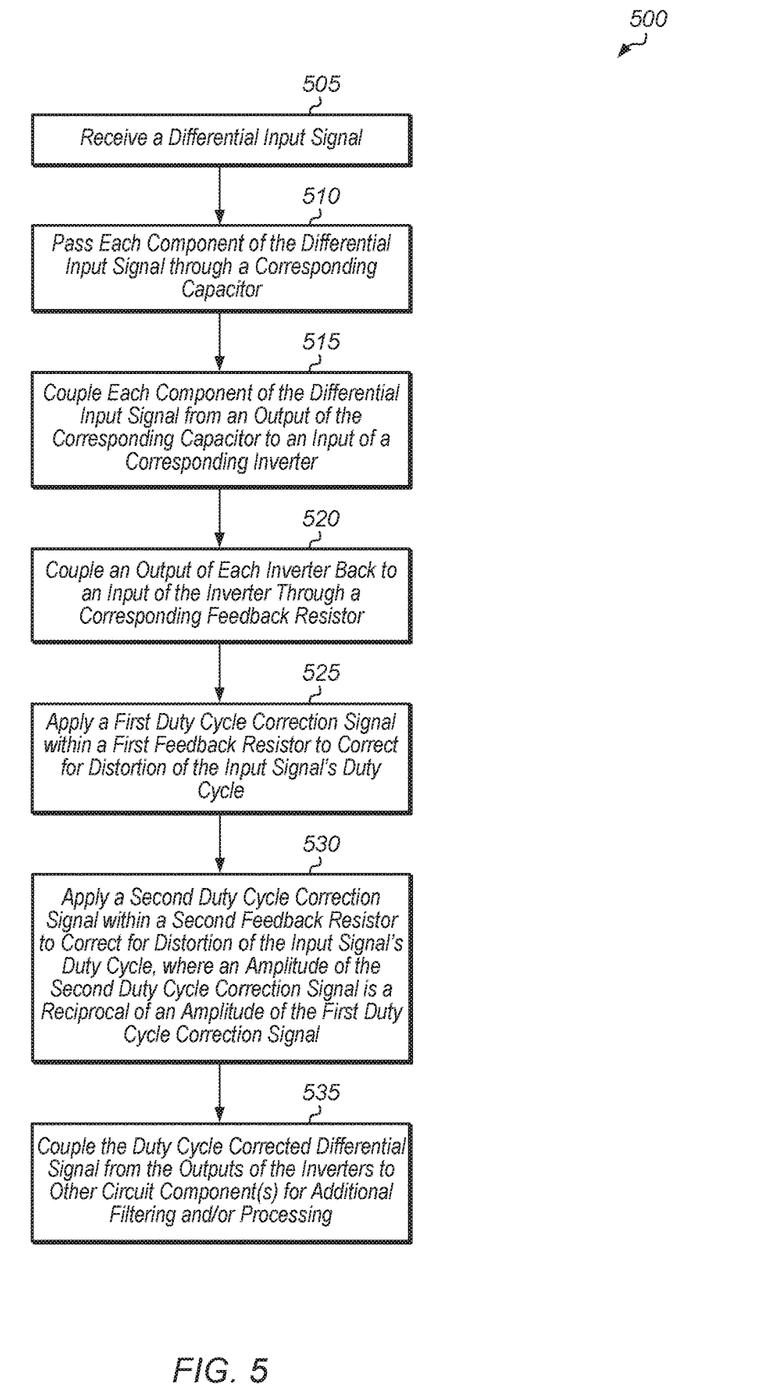
FIG. 5 is a generalized flow diagram illustrating one implementation of a method for applying a duty cycle correction value to a level shifter via a common mode resistor.

Turning now to FIG. 4, one implementation of a method 400 for applying a duty cycle correction value to a level shifter via a common mode resistor is shown. For purposes of discussion, the steps in this implementation and those of FIG. 5 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 400.

A circuit receives a single-ended input signal (block 405). The input signal can be a data signal or a clock signal. The input signal is passed through a capacitor (block 410). The capacitor blocks any direct current (DC) signal components within the input signal. The input signal is coupled from an output of the capacitor to an input of an inverter (block 415). An output of the inverter is coupled back to the input of the inverter through at least one feedback resistor (block 420). A duty cycle correction signal is applied within the at least one feedback resistor to correct for distortion of the input signal's duty cycle (block 425). In one implementation, the duty cycle correction signal is applied to cause the duty cycle of the input signal to be a predetermined value (e.g., 50%) or within a given range. In various implementations, the injection point at where the duty cycle correction signal is applied can be programmable. Accordingly, the duty cycle correction can be applied at different tapping points within the at least on feedback resistor. Depending on the implementation, the duty cycle correction signal can be a voltage or a current. Then, the duty cycle corrected signal is coupled from the output of the inverter to other circuit component(s) for additional filtering and/or processing (block 430). After block 430, method 400 ends. It is noted that distortion on the input signal's duty cycle can be detected at a later stage in the circuitry of the overall system or apparatus. For example, this distortion can be detected during a training phase. An indication of the amount of the distortion can be coupled to a control unit which applies the duty cycle correction signal within the at least one feedback resistor. The control unit can then use the indication to determine the magnitude of the duty cycle correction signal. After block 430, method 400 ends.

Referring now to FIG. 5, one implementation of a method 500 for applying a duty cycle correction value to a level shifter via a common mode resistor is shown. A circuit receives a differential input signal (block 505). The differential input signal can be a data signal or a clock signal. The circuit passes each component of the differential input signal through a corresponding capacitor (block 510). Each component of the differential input signal is coupled from an output of the corresponding capacitor to an input of a corresponding inverter (block 515). An output of each inverter is connected back to an input of the inverter through a corresponding feedback resistor (block 520). A first duty cycle correction signal is applied within a first feedback resistor to correct for distortion of the input signal's duty cycle (block 525). A second duty cycle correction signal is applied within a second feedback resistor to correct for distortion of the input signal's duty cycle, where an amplitude of the second duty cycle correction signal is a reciprocal of an amplitude of the first duty cycle correction signal (block 530). For example, if the first offset value is a positive 10 millivolts (mV) applied to the positive polarity signal, then the second offset value is a negative 10 mV applied to the negative polarity signal. Then the duty cycle corrected differential signal is coupled from the outputs of the inverters to other circuit component(s) for additional filtering and/or processing (block 535). After block 535, method 500 ends.

Figure 6:
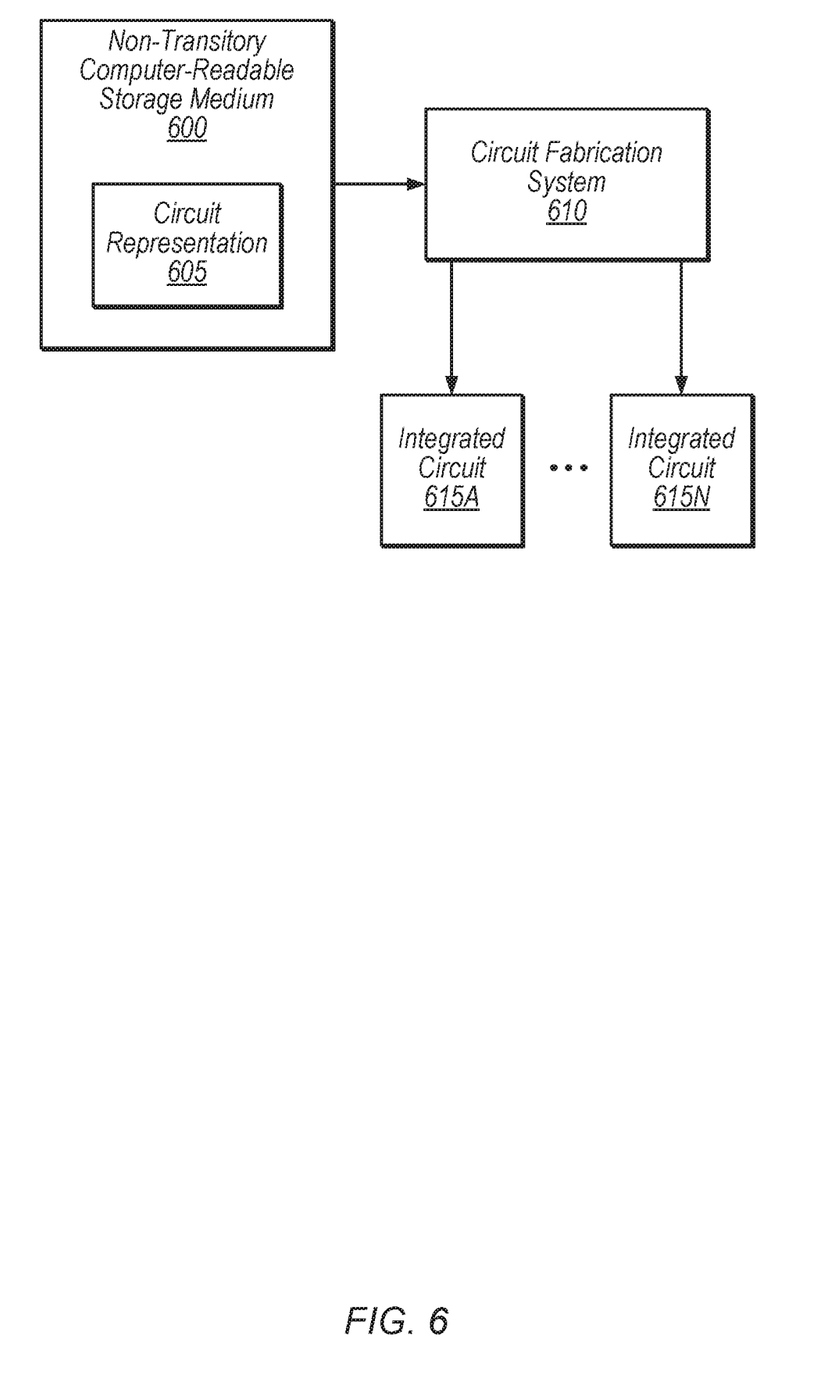
FIG. 6 is a block diagram illustrating one implementation of a non-transitory computer-readable storage medium that stores a circuit representation.

Turning now to FIG. 6, a block diagram illustrating one implementation of a non-transitory computer-readable storage medium 600 that stores a circuit representation 605 is shown. In one implementation, circuit fabrication system 610 processes the circuit representation 605 stored on non-transitory computer-readable storage medium 600 and fabricates any number of integrated circuits 615A-N based on the circuit representation 605.

Non-transitory computer-readable storage medium 600 can include any of various appropriate types of memory devices or storage devices. Medium 600 can be an installation medium (e.g., a thumb drive, CD-ROM), a computer system memory or random access memory (e.g., DRAM, DDR RAM, SRAM, EDO RAM, Rambus RAM), a non-volatile memory (e.g., a Flash, magnetic media, a hard drive, optical storage), registers, or other types of memory elements. Medium 600 can include other types of non-transitory memory as well or any combinations thereof. Medium 600 can include two or more memory mediums which reside in different locations (e.g., in different computer systems that are connected over a network).

In various implementations, circuit representation 605 is specified using any of various appropriate computer languages, including hardware description languages such as, without limitation: VHDL, Verilog, SystemC, SystemVerilog, RHDL, etc. Circuit representation 605 is usable by circuit fabrication system 610 to fabricate at least a portion of one or more of integrated circuits 615A-N. The format of circuit representation 605 is recognizable by at least one circuit fabrication system 610. In some implementations, circuit representation 605 includes one or more cell libraries which specify the synthesis and/or layout of the integrated circuits 615A-N.

Circuit fabrication system 610 includes any of various appropriate elements configured to fabricate integrated circuits. This can include, for example, elements for depositing semiconductor materials (e.g., on a wafer, which can include masking), removing materials, altering the shape of deposited materials, modifying materials (e.g., by doping materials or modifying dielectric constants using ultraviolet processing), etc. Circuit fabrication system 610 can also perform testing of fabricated circuits for correct operation.

In various implementations, integrated circuits 615A-N operate according to a circuit design specified by circuit representation 605, which can include performing any of the functionality described herein. For example, integrated circuits 615A-N can include any of various elements shown in circuit 300 (of FIG. 3) and/or multiple instances of circuit 300. Furthermore, integrated circuits 615A-N can perform various functions described herein in conjunction with other components. For example, integrated circuits 615A-N can be coupled to voltage supply circuitry that is configured to provide a supply voltage (e.g., as opposed to including a voltage supply itself). Further, the functionality described herein can be performed by multiple connected integrated circuits.

As used herein, a phrase of the form "circuit representation that specifies a design of a circuit . . . " does not imply that the circuit in question must be fabricated in order for the element to be met. Rather, this phrase indicates that the circuit representation describes a circuit that, upon being fabricated, will be configured to perform the indicated actions or will include the specified components.

In various implementations, program instructions are used to implement the methods and/or mechanisms described herein. For example, program instructions are written that describe the behavior or design of hardware. In one implementation, such program instructions are represented by a hardware design language (HDL) such as Verilog. In various implementations, the program instructions are stored on any of a variety of non-transitory computer readable storage mediums. The storage medium is accessible by a computing system during use to provide the program instructions to the computing system for circuit fabrication, program execution, or otherwise. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
 a first capacitor;
 a first inverter; and
 a first feedback resistor;
 wherein the circuit is configured to:
  receive a first input signal at an input of the first capacitor;
  couple the first input signal from an output of the first capacitor to an input of the first inverter, wherein an output of the first inverter is connected back to the input of the first inverter via the first feedback resistor; and
  apply a first duty cycle correction signal within the first feedback resistor to correct for duty cycle distortion of the first input signal.

2. The circuit as recited in claim 1, wherein the duty cycle correction signal is a voltage.

3. The circuit as recited in claim 1, wherein the duty cycle correction signal is a current.

4. The circuit as recited in claim 1, wherein the circuit further comprises:
 a second capacitor;
 a second inverter; and
 a second feedback resistor;
 wherein the circuit is configured to:
  receive a second input signal at an input of the second capacitor;
  couple the second input signal from an output of the second capacitor to an input of the second inverter, wherein an output of the second inverter is connected back to the input of the second inverter via the second feedback resistor; and apply a second duty cycle correction signal within the second feedback resistor to correct for duty cycle distortion of the second input signal, wherein an amplitude of the second duty cycle correction signal is a reciprocal of an amplitude of the first duty cycle correction signal.

5. The circuit as recited in claim 4, wherein the first and second input signals are components of a given differential signal.

6. The circuit as recited in claim 1, wherein the circuit is further configured to apply the first duty cycle correction signal to a given tapping point within the first feedback resistor, and wherein a location of the given tapping point within the first feedback resistor is programmable.

7. The circuit as recited in claim 1, wherein the circuit is configured to convey a duty cycle corrected signal on the output of the first inverter to a second inverter.

8. A method comprising:
receiving a first input signal on an input of a first capacitor;
coupling the first input signal from an output of the first capacitor to an input of a first inverter, wherein an output of the first inverter is connected to the input of the first inverter via a first feedback resistor; and
applying a first duty cycle correction signal within the first feedback resistor to correct for duty cycle distortion of the first input signal.

9. The method as recited in claim 8, wherein the duty cycle correction signal is a voltage.

10. The method as recited in claim 8, wherein the duty cycle correction signal is a current.

11. The method as recited in claim 8, further comprising:
receiving a second input signal on an input of a second capacitor;
coupling the second input signal from an output of the second capacitor to an input of a second inverter, wherein an output of the second inverter is connected back to the input of the second inverter via a second feedback resistor; and
applying a second duty cycle correction signal within the second feedback resistor to correct for duty cycle distortion of the second input signal, wherein an amplitude of the second duty cycle correction signal is a reciprocal of an amplitude of the first duty cycle correction signal.

12. The method as recited in claim 11, wherein the first and second input signals are components of a given differential signal.

13. The method as recited in claim 8, further comprising applying the first duty cycle correction signal to a given tapping point within the first feedback resistor, wherein a location of the given tapping point within the first feedback resistor is programmable.

14. The method as recited in claim 8, further comprising conveying a duty cycle corrected signal on the output of the first inverter to a second inverter.

15. A circuit comprising:
a first inverter; and
a first feedback resistor;
wherein the circuit is configured to:
receive a first input signal on an input of the first inverter, wherein an output of the first inverter is connected back to the input of the first inverter via the first feedback resistor; and
apply a first duty cycle correction signal within the first feedback resistor to correct for duty cycle distortion of the first input signal.

16. The circuit as recited in claim 15, wherein the duty cycle correction signal is a voltage.

17. The circuit as recited in claim 15, wherein the duty cycle correction signal is a current.

18. The circuit as recited in claim 15, wherein the circuit further comprises:
a second inverter; and
a second feedback resistor;
wherein the circuit is configured to:
receive a second input signal on an input of the second inverter, wherein an output of the second inverter is connected back to the input of the second inverter via the second feedback resistor; and
apply a second duty cycle correction signal within the second feedback resistor to correct for duty cycle distortion of the second input signal, wherein an amplitude of the second duty cycle correction signal is a reciprocal of an amplitude of the first duty cycle correction signal.

19. The circuit as recited in claim 18, wherein the first and second input signals are components of a given differential signal.

20. The circuit as recited in claim 15, wherein the circuit is further configured to apply the first duty cycle correction signal to a given tapping point within the first feedback resistor, wherein a location of the given tapping point within the first feedback resistor is programmable.

* * * * *